United States Patent
Reboh et al.

(10) Patent No.: US 10,263,077 B1
(45) Date of Patent: Apr. 16, 2019

(54) METHOD OF FABRICATING A FET TRANSISTOR HAVING A STRAINED CHANNEL

(71) Applicant: COMMISSARIAT A L'ENERGIE ATOMIQUE ET AUX ENERGIES ALTERNATIVES, Paris (FR)

(72) Inventors: Shay Reboh, Grenoble (FR); Remi Coquand, Les Marches (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/852,681

(22) Filed: Dec. 22, 2017

(51) Int. Cl.
| | |
|---|---|
| H01L 21/335 | (2006.01) |
| H01L 21/8232 | (2006.01) |
| H01L 29/10 | (2006.01) |
| H01L 21/02 | (2006.01) |
| H01L 29/78 | (2006.01) |
| H01L 21/324 | (2006.01) |

(52) U.S. Cl.
CPC ...... *H01L 29/1054* (2013.01); *H01L 21/0242* (2013.01); *H01L 21/0245* (2013.01); *H01L 21/02381* (2013.01); *H01L 21/02433* (2013.01); *H01L 21/02488* (2013.01); *H01L 21/02667* (2013.01); *H01L 21/324* (2013.01); *H01L 29/785* (2013.01)

(58) Field of Classification Search
CPC .......... H01L 21/02381; H01L 21/0242; H01L 21/02433; H01L 21/0245; H01L 29/1054; H01L 29/645

USPC .......................................................... 438/142
See application file for complete search history.

(56) References Cited

U.S. PATENT DOCUMENTS

| | | | |
|---|---|---|---|
| 9,728,635 B1* | 8/2017 | Cheng | H01L 29/7827 |
| 9,960,254 B1* | 5/2018 | Bao | H01L 29/66666 |
| 10,020,398 B1* | 7/2018 | Cheng | H01L 29/7849 |
| 2016/0260819 A1* | 9/2016 | Borrel | H01L 29/512 |
| 2017/0194498 A1* | 7/2017 | Berthelon | H01L 21/02236 |

OTHER PUBLICATIONS

U.S. Appl. No. 15/490,212, filed Apr. 18, 2017, US-20170309483-A1, Shay Reboh, et al.

(Continued)

*Primary Examiner* — David S Blum
(74) *Attorney, Agent, or Firm* — Oblon, McClelland, Maier & Neustadt, L.L.P.

(57) ABSTRACT

Method for fabricating at least one FET transistor (100*a*, 100*b*) comprising:
fabrication of at least one first semiconducting portion (114) that will form a channel of the FET transistor,
fabrication of second semiconducting portions (122, 124, 126) that will be used to form source and drain regions, such that the first semiconducting portion is located between first ends of the second semiconducting portions and such that second ends of the second semiconducting portions opposite the first ends, are in contact with bearing surfaces, and comprising at least one semiconducting material for which the crystalline structure or the atomic organisation, can be modified when a heat treatment is applied to it;
heat treatment generating a modification to the crystalline structure of the semiconducting material of the second semiconducting portions and creating a strain (128) in the first semiconducting portion.

12 Claims, 6 Drawing Sheets

(56) References Cited

OTHER PUBLICATIONS

U.S. Appl. No. 15/452,049, filed Mar. 7, 2017, US-2017-0263607-A1, Sylvain Maitrejean, et al.
U.S. Appl. No. 15/523,742, filed May 2, 2017, US-2017-0358459-A1, Shay Reboh, et al.
U.S. Appl. No. 15/602,829, filed May 23, 2017, US-2017-0345931-A1, Shay Reboh, et al.
U.S. Appl. No. 15/603,738, filed May 24, 2017, US-2017-0345915-A1, Remi Coquand, et al.
U.S. Appl. No. 15/852,050, filed Dec. 22, 2017, Shay Reboh, et al.
U.S. Appl. No. 15/711,549, filed Sep. 21, 2017, Shay Reboh, et al.
U.S. Appl. No. 14/555,897, filed Nov. 28, 2014, US-2015-0155170-A1, Shay Reboh et al.
U.S. Appl. No. 14/575,329, filed Dec. 18, 2014, US-2015-0179474-A1, Sylvain Maitrejean, et al.
U.S. Appl. No. 14/950,416, filed Nov. 24, 2015, US-2016-0149039-A1, Shay Reboh, et al.
U.S. Appl. No. 15/092,002, filed Apr. 6, 2016, US-2016-0300927-A1, Shay Reboh, et al.
U.S. Appl. No. 15/261,226, filed Sep. 9, 2016, US-2017-0076997-A1, Shay Reboh, et al.
U.S. Appl. No. 15/837,298, filed Dec. 11, 2017, Sylvain Barraud, et al.
U.S. Appl. No. 15/837,405, filed Dec. 11, 2017, Shay Reboh, et al.
U.S. Appl. No. 15/837,217, filed Dec. 11, 2017, Shay Reboh, et al.
U.S. Appl. No. 15/837,281, filed Dec. 11, 2017, Shay Reboh, et al.
U.S. Appl. No. 15/852,648, filed Dec. 22, 2017, Remi Coquand, et al.
U.S. Appl. No. 15/852,671, filed Dec. 22, 2017, Shay Reboh, et al.
M. Bauer, et al., "Tensile strained selective Silicon Carbon alloys for recessed source drain areas of devices", $210^{th}$ ECS Meeting, 2006, 1 page.

\* cited by examiner

METHOD OF FABRICATING A FET TRANSISTOR HAVING A STRAINED CHANNEL

TECHNICAL DOMAIN AND PRIOR ART

The invention relates to the domain of fabricating FET transistors with strained channels. The invention is applicable particularly to fabrication of GAAFET ("Gate All Around Field Effect Transistor"), FinFET ("Fin Field Effect Transistor", in which the channel is formed by a finger or a fin surrounded by the transistor gate) or VFET (Vertical Field Effect Transistor"). In general, the invention is applicable to the fabrication of transistors advantageously intended for high performance low consumption logic applications of microelectronics.

GAAFET, FinFET and VFET type transistors form part of the family of transistors with a so-called 3D architecture. In such an architecture, the transistor gate surrounds the channel which can improve electrostatic control of the channel by the gate.

In a GAAFET transistor, the channel is formed by the superposition of several nanowires or nanosheets, each surrounded by the gate. This configuration has the advantage that it gives a good compromise between the obtained electrostatic control of the channel by the gate and the control current.

A mechanically deformed crystalline material is a material with elongated or shortened crystalline mesh parameter(s). In the case in which the deformed mesh parameter is larger than that "natural" parameter of the crystalline material, the material is said to be tensilely strained. When the strained mesh parameter is smaller than the natural mesh parameter, the material is said to be in compressive strain or in compression.

Mechanical strain states are associated with these mechanical deformation states of a crystalline material. These deformation states are also commonly referred to as mechanical strain states. In this application, the concept of deformation is generically referred to by the generic term "strain".

The performances of a transistor can be improved through the use of a strained channel, in other words in which the semiconductor forming the channel is strained. The nature of this strain may be uniaxial and may be oriented parallel to the length of the channel (in other words the dimension of the channel that is approximately parallel to the direction of current circulation in the channel), or biaxial, in other words oriented along two directions approximately perpendicular to each other and one of which is parallel to the length of the channel and the other is parallel to the width of the channel (in other words the channel dimension that is in the principal plane of the layer in which the channel is formed, approximately perpendicular to the direction of current circulation in the channel).

In a P type transistor, a compressive strain or a compression strain applied to the channel can improve the mobility of charge carriers. In an N type transistor, a tension strain applied to the channel can improve the mobility of charge carriers.

Such a strain in the transistor channel can be applied by the source and drain regions of this transistor. A tension or compression strain can be generated in the channel by making the source and drain regions of the transistor with a semiconductor with a mesh size different from the mesh size of the semiconductor forming the channel.

In the case of P type transistors with silicon channels, the source and drain regions of these transistors can thus be made by epitaxy of SiGe that has a larger mesh parameter than the silicon used in transistor channels. As the concentration of germanium in the SiGe increases, the difference in mesh parameters between the silicon in the channels and the SiGe in the source and drain regions increases, and therefore the compression strain generated in the channels also increases. In the case of N type transistors with silicon channels, the source and drain regions can be made from silicon doped by carbon atoms (Si:C) that has a smaller mesh parameter then the silicon in the channels, thus generating a tensile strain in the channels.

The source and drain regions are fabricated by epitaxy with as few defects as possible, to that this strain is obtained optimally in the transistor channels. The presence of defects in the crystalline structure of the semiconductor in the source and drain regions tends to induce relaxation of the strain generated in these regions, such that at least some of the elastic energy of this strain is lost and does not appear in the channel.

In the case of GAAFET transistors, epitaxy of the source and drain regions is made from the surfaces of several distinct portions of silicon, namely the ends of nanowires that are at a spacing from each other, and also from the substrate. These multiple growth fronts tend to form a defective semiconducting material that is not monocrystalline coherent with the material in the channels and the substrate. Therefore in this case it is impossible to obtain a strain generated from a difference between the mesh parameter of the semiconductor source and drain regions and the mesh parameter of the channel.

Moreover, when the substrate does not form a growth surface during epitaxy of the source and drain regions, for example as is the case for GAAFET or FinFET transistors made on an SOI (Silicon-On-Insulator) substrate or on a bulk substrate comprising electrical insulation present under the source and drain regions, the substrate does not form a growth surface for epitaxy because it is the BOX (Buried OXide) layer or the electrical insulation that will be present under the source and drain regions of the substrate that will be present on the surface at the source and drain regions. Growth that occurs from the crystalline front(s) formed only by the surfaces of the ends of the nanowires (for a GAAFET transistor) or the portion (or fin) forming the channel (for a FinFET transistor) takes place along directions (along the axis along which the channels extend) named free surfaces, in other words the semiconductor formed by this growth does not directly impose a strain along this axis or this direction.

A similar problem also occurs when making VFET transistors in which the semiconducting portions forming the channels and the source and drain regions are made by successive epitaxies oriented perpendicular to the surface of the substrate on which these transistors are made. The presence of a free surface along the semiconductor growth direction of these portions strongly reduces the required strain effect by using semiconductors in which the mesh parameter of the semiconductor of the channel region is different from that of the source and drain regions. However, the growth of semiconductors with different mesh parameters in the vertical structure of such a transistor can lead to deformations of the channel in the plane parallel to the substrate on which the transistor is made, which results in the appearance of strains in the channel in the vertical charge transport direction. However, these strains are limited in comparison with strains that would be obtained and generated due to a direct effect of the difference in mesh parameters along the vertical direction.

PRESENTATION OF THE INVENTION

One purpose of this invention is to disclose a method of fabricating at least one strained channel FET transistor that does not have the disadvantages of the methods described above, in other words that can be used to obtain a sufficient strain within the transistor channel, regardless of the architecture of the transistor, particularly of the GAA-FET, FinFET or VFET type, regardless of the nature of the surface of the substrate on which the transistor is made.

To achieve this, this invention discloses a method of fabricating at least one FET transistor including the implementation of at least the following steps:
- fabricate at least a first semiconducting portion that will form a channel of the FET transistor,
- fabricate second semiconducting portions that will form source and drain regions of the FET transistor, such that the first semiconducting portion is located between first ends of the second semiconducting portions and such that second ends of the second semiconducting portions opposite the first ends, are in contact with bearing surfaces, and comprising at least one semiconducting material for which the crystalline structure or the atomic organisation, can be modified when a heat treatment is applied to it;
- heat treatment generating a modification to the crystalline structure of the semiconducting material of the second semiconducting portions and creating a strain in the first semiconducting portion.

In this method, a semiconducting material for which the crystalline structure can be modified when a heat treatment is applied to it is used to form the second semiconducting portions that will form the source and drain regions of the transistor. This ability to have a crystalline structure or a mesh parameter that can be modified by the application of a heat treatment is used judiciously in this case because it can introduce the strain after the second semiconducting portions have been formed and particularly after the ends of the semiconducting portions opposite the portions at the channel end are in contact with bearing surfaces. The heat treatment applied after fabrication of the second semiconducting portions triggers the change to the crystalline structure of the semiconducting material. Therefore, the mesh parameter of the semiconducting material in the second semiconducting portions is modified by the heat treatment, causing a change in the volume of the second semiconducting portions and thus creating a strain in the channel due to expansion or contraction of the semiconducting material in the second semiconducting portions generated by the change in the mesh parameter of the semiconducting material.

The invention is applicable to all so-called 3D transistor architectures, particularly of the GAAFET, FinFET and VFET types.

The semiconducting material of the second semiconducting portions may be in a metastable state before the heat treatment is applied. In this case, application of the heat treatment triggers a change in the state of the semiconducting material that changes to a more stable state.

The expression "metastable state" denotes a state with an apparent stability that is not the lowest energy state or the most thermodynamically stable state.

As a variant, the modification to the crystalline structure of the semiconducting material may correspond to a phase change of the semiconducting material.

The semiconducting material of the second semiconducting portions may comprise at least one chemical element that can be precipitated during application of the heat treatment. This chemical element capable of precipitating can be the cause of the metastable state of the semiconducting material. For example, the semiconducting material may comprise a first chemical element that is the majority element present in the semiconducting material and that confers the semiconducting nature on this material, and a second chemical element capable of precipitating during application of the heat treatment and the atoms of which are substituted for some atoms of the first chemical element. The mesh parameter of the semiconducting material obtained is smaller than the mesh parameter that would be obtained with the second chemical element alone in the semiconducting material. Application of the heat treatment causes precipitation of atoms of the second chemical element, with the result that these atoms become interstitial and that the mesh parameter of the semiconducting material becomes equal to the natural value of the mesh parameter of the first chemical element.

The chemical element capable of precipitating and present in the semiconducting material is chosen such that it can be precipitated when the second semiconducting portions are exposed to the heat treatment, in other words are exposed to a large temperature rise.

The method may be such that:
- the semiconducting material of the second semiconducting portions comprises silicon or SiGe,
- the chemical element that can be precipitated during application of the heat treatment comprises carbon, and
- the FET transistor fabricated is of the P type.

In this case, during fabrication of the second semiconducting portions, carbon atoms substitute for some silicon or SiGe atoms in the semiconducting material. The mesh parameter of the semiconducting material, that is Si:C or SiGe:C, is smaller than the mesh parameter of silicon or SiGe without carbon. Application of the heat treatment causes precipitation of carbon atoms that become interstitial, and the mesh parameter of the semiconducting material becomes equal to the natural value of the mesh parameter of silicon or SiGe.

The atomic percentage of carbon in the semiconducting material can be between about 1% and 3%.

As a variant, the method may be such that:
- the semiconducting material of the second semiconducting portions may comprise germanium,
- the chemical element that can be precipitated during application of the heat treatment comprises tin, and
- the FET transistor fabricated is of the N type.

In this case, during fabrication of the second semiconducting portions, tin atoms substitute for some germanium atoms in the semiconducting material. The mesh parameter of the semiconducting material, that is GeSn, is smaller than the mesh parameter of germanium without tin. Application of the heat treatment causes precipitation of tin atoms that become interstitial, and the mesh parameter of the semiconducting material becomes equal to the natural value of the mesh parameter of germanium.

The modification to the crystalline structure of GeSn caused by application of the heat treatment can be seen as corresponding to a change in the phase of the tin present in the GeSn.

The second semiconducting portions may be fabricated by epitaxy.

In this case, when the FET transistor is of the P type, the epitaxy forming the second semiconducting portions may also apply doping of the semiconducting material of the second semiconducting portions.

The heat treatment step may be applied at a temperature between about 700° C. and 1050° C. and/or for a duration between about 1 second and 10 minutes.

When the fabricated transistor is of the GAAFET type, fabrication of the first semiconducting portion comprises application of the following steps:

etch a stack of layers formed on a substrate and comprising at least one layer of a first semiconducting material that will form the first semiconducting portion located between the substrate and at least one layer of a second semiconducting material different from the first semiconducting material and that can be etched selectively relative to the first semiconducting material, forming at least one stack of nanowires comprising at least one nanowire of the second semiconducting material located between the substrate and at least one nanowire of the first semiconducting material, fabricate at least one dummy gate and external spacers between which the dummy gate is formed, covering at least one part of the stack of nanowires formed from portions of the nanowires of the first and second semiconducting materials, etch the stack of nanowires such that only said at least one part of the stack of nanowires is kept, remove parts of the portion of the nanowire of the second semiconducting material covered by external spacers, forming cavities located under the external spacers, deposit at least one dielectric material in the cavities, forming internal spacers, in which the second semiconducting portions are fabricated by epitaxy after the first semiconducting portion has been fabricated, and also comprising, after application of the heat treatment:

deposition of a dielectric material encapsulating the second semiconducting portions, removal of the dummy gate, fabrication of a gate between the external spacers and around the first semiconducting portion.

The steps used may form several FET transistors located adjacent to each other such that some second semiconducting portions form source and drain regions common to adjacent FET transistors in pairs.

As a variant, when the fabricated transistor is of the VFET type, the steps to fabricate the first and second semiconducting portions comprise application of the following steps:

epitaxy of one of the second semiconducting portions on a substrate, then epitaxy of the first semiconducting portion on said one of the second semiconducting portions, then epitaxy of the other of the second semiconducting portions on the first semiconducting portion, and in which the heat treatment is applied after deposition of at least one dielectric material encapsulating the second semiconducting portions and forming at least a first of the bearing surfaces, or after the fabrication of electrical contacts connected to the second semiconducting portions and forming at least the first of the bearing surfaces, a second of the bearing surfaces being formed by the substrate.

BRIEF DESCRIPTION OF THE DRAWINGS

This invention will be better understood after reading the description of example embodiments given purely for information and that are in no way limitative with reference to the appended drawings on which.

Identical, similar or equivalent parts of the different figures described below have the same numeric references to facilitate comparison between the different figures.

The different parts shown on the figures are not necessarily all at the same scale, to make the figures more easily understandable.

It must be understood that the different possibilities (variants and embodiments) are not mutually exclusive and that they can be combined with each other.

DETAILED PRESENTATION OF PARTICULAR EMBODIMENTS

FIGS. 1 to 8 show the steps involved in fabrication of strained channel FET transistors 100 according to a first embodiment. In this first embodiment, the fabricated transistors 100 are P type GAAFET transistors. Although only one transistor 100 is shown on FIGS. 1 to 4, this method is used in this disclosure to make several transistors 100 electrically connected in series and such that at least one of the source and drain regions is common to two transistors 100 fabricated adjacent to each other, as can be seen on FIGS. 5 to 8.

The transistors 100 are made from a stack of two different crystalline semiconducting layers deposited on a substrate 102. In the first embodiment described herein, the substrate 102 corresponds to a bulk semiconducting substrate, for example made of silicon, on which the stack is formed comprising first and second layers formed from two different semiconducting material arranged in alternation one on top of the other. The stack comprises at least one first layer of a first semiconducting material located on at least one second layer of a second semiconducting material, this second layer being located between the first layer and the substrate 102. Each of the first layers will form semiconducting nanowires that form the channels of transistors 100. In the first embodiment described herein, each of the first layers is located between two second layers.

Furthermore, the second semiconducting material can be etched selectively relative to the first semiconducting material and to the materials of the external and internal spacers. In the first embodiment described herein, this stack comprises three first layers and four second layers alternating such that each of the first layers is located between two second layers.

The first and second semiconducting materials are crystalline in this case and are formed on the substrate 102 by epitaxy. In the example described herein the substrate 102 and the first layers comprise silicon, and the second layers comprise SiGe with a proportion of germanium for example between about 20% ($Si_{0.8}Ge_{0.2}$) and 50% ($Si_{0.5}Ge_{0.5}$).

As a variant, the substrate used may be of the semiconductor on insulator type, for example SOI (silicon on insulator), in this case with the surface layer or thin layer of the SOI substrate that can form one of the second layers of the stack. In the first embodiment described herein in which the second layers comprise SiGe, a substrate of the SiGeOI type may be used, this SiGeOI substrate possibly being created from an SOI substrate.

Each of the first and second layers may for example be between 5 nm and 9 nm thick.

Figure 1:
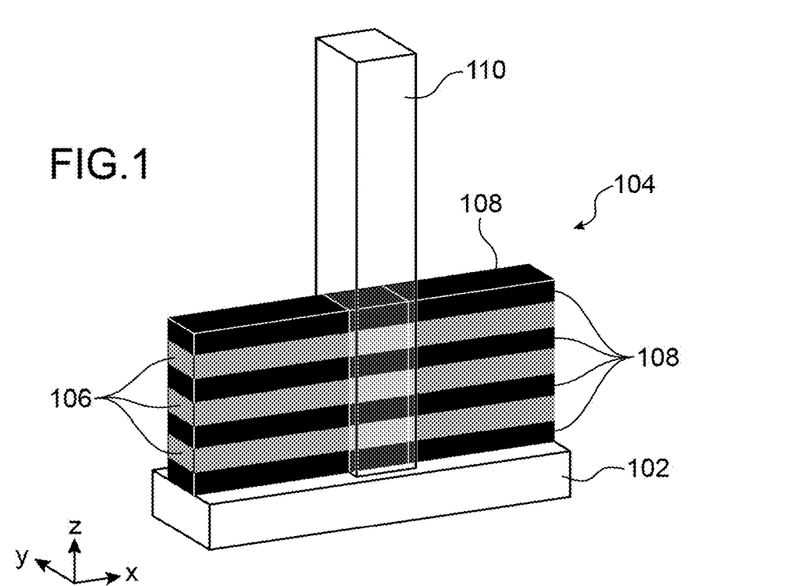
FIGS. 1 to 8 diagrammatically show the steps in a method of fabricating strained channel FET transistors according to a first embodiment of this invention.
Figure 2:
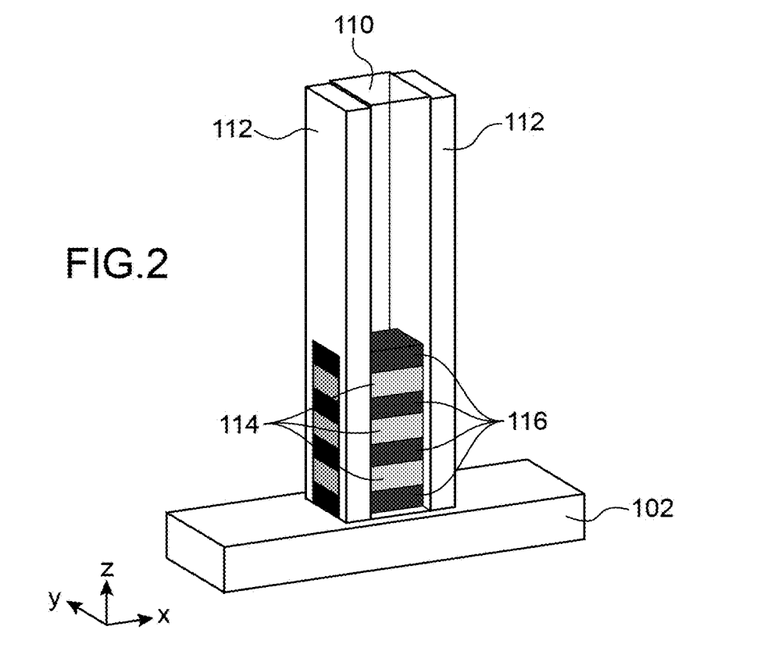

The stack of layers comprising the first and second layers is etched in the form of elongated portions as shown on FIG. 1 forming a stack 104 of nanowires located on the substrate 102.

The portions obtained from the first layers form first nanowires 106 of the first semiconducting material and the portions obtained from the second layers form second nanowires 108 of the second semiconducting material. On the example in FIG. 1, the stack 104 comprises three first nanowires 106 each located between two second nanowires 108.

The width of the stack 104, that corresponds to the dimension of the stack parallel to the Y axis that can be seen on FIG. 1, is equal to the required width of the first nanowires 106 that will form the channels of transistors 100, and is therefore equal to the required channel width.

A dummy gate 110 is then made, for example by lithography and etching, on the stack 104, at the location at which the future gate of each of the transistors 100 will be fabricated. A single dummy gate 110 is shown on FIG. 2. The dummy gate 110 is formed on a part of the stack 104 composed of portions of the first nanowires 106 that will form the channel of transistor 100, and portions of second nanowires 108 between which said portions of the first nanowires 106 are located, and also covers the lateral flanks of these portions of nanowires 106, 108 (at the faces of the stack 104 parallel to the (X,Z) plane).

External spacers 112 are then fabricated, for example by deposition and etching, on the stack 104 and adjacent to the lateral flanks of each of the dummy gates 110. These external 112 spacers cover parts of the first nanowires 106 that will form source and drain extension regions of the transistors 100. The length, or depth, of these external spacers 112 (dimension parallel to the X axis shown on FIG. 2) may for example be between about 3 and 8 nm. The external spacers 112 will isolate the gates (that will be used in a later step of the method) from the source and drain regions of each of the transistors 100.

For example, the dummy gate 110 comprises amorphous or polycrystalline silicon, and the external spacers 112 comprise for example SiN and/or $Si_3N_4$ and/or SiBCN.

The parts of the stack 102 not covered by the dummy gate 110 and by the external spacers 112 are then etched (see FIG. 2), for example when the external spacers 112 are etched. Remaining portions 114 of the first nanowires 106 will form channels of transistors 100 and form first semiconducting portions. Each of the portions 114 is interposed between two remaining portions 116 of the second nanowires 108. The shape of each of the remaining portions 114 and 116 corresponds to the shape of a nanowire (shorter than the initial nanowires 106, 108).

Figure 3:
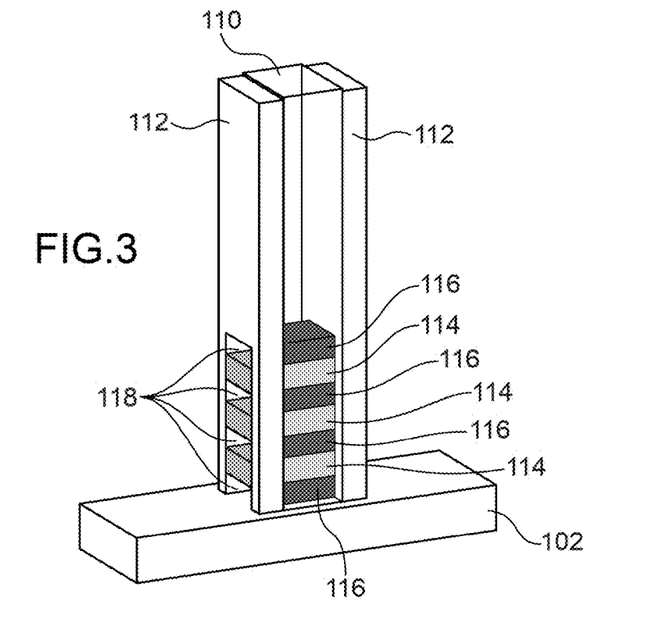

Cavities 118 can then be made under the external spacers 112 by etching a part (a few nanometres along the direction parallel to the length of the nanowires 116, 114, for example between about 3 nm and 8 nm) of the remaining portions 116 from the ends of these portions (see FIG. 3).

Figure 4:
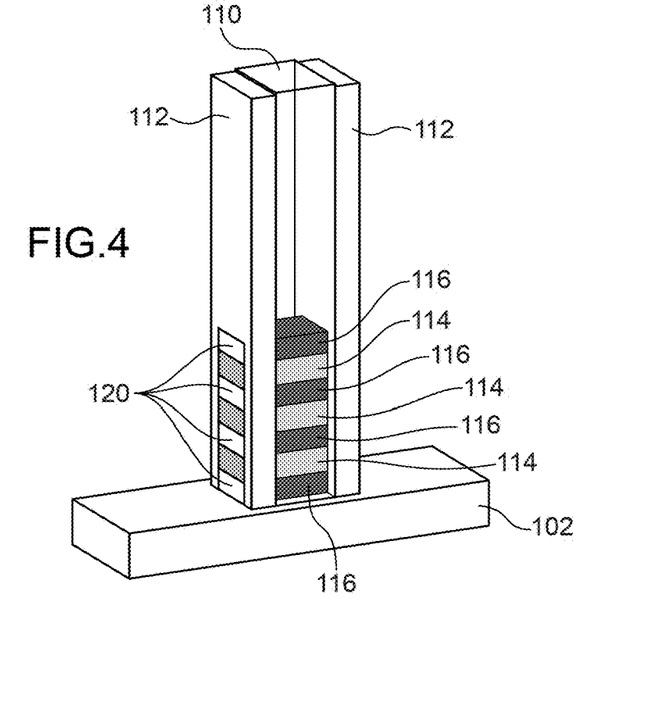

Internal spacers 120 are then made in the cavities 118 by depositing a dielectric material in these cavities 118 (see FIG. 4).

Figure 5:
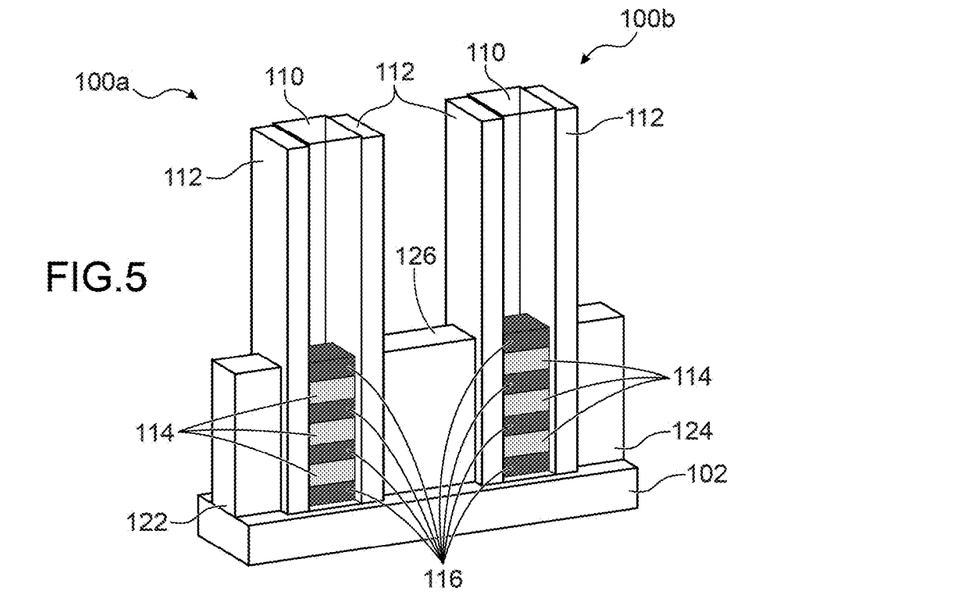
Figure 6:
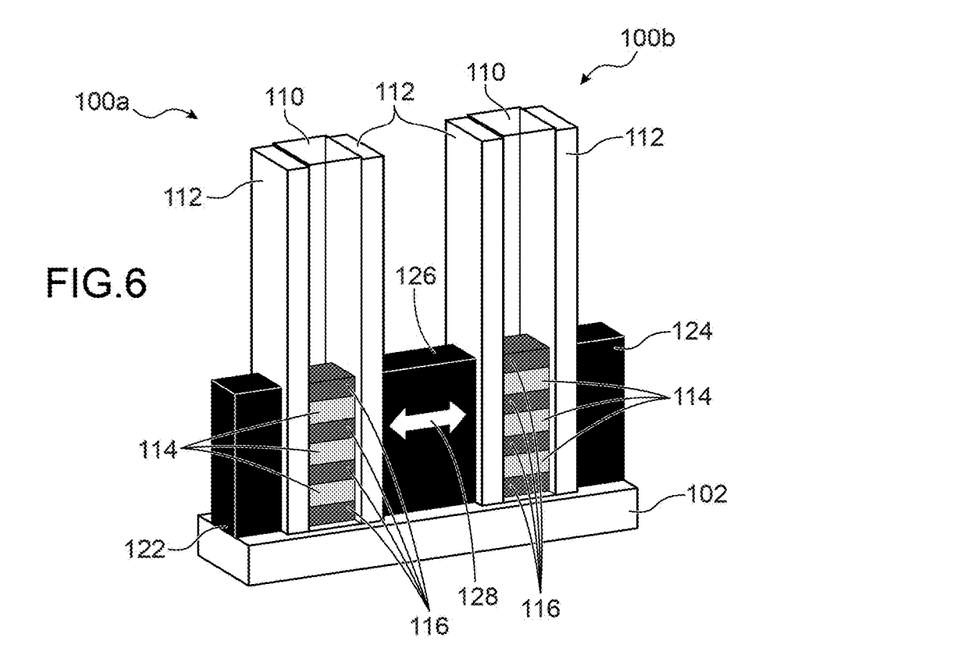

The source and drain regions of the transistors 100 are then made by epitaxy from the ends of the remaining portions 114 and from the substrate 102 when the top face of the substrate 102 on which the remaining portions 114, 116 are located forms a semiconducting surface from which the semiconductor of the source and drain regions, can grow by epitaxy. As a variant, when the transistors 100 are made from a semiconductor on insulator type substrate, in other words such that the stack 104 is located on the buried dielectric layer of this substrate, epitaxy is only done from the ends of the remaining portions 114, the substrate not forming a growth front from which the semiconductor of the source and drain regions can grow. FIG. 5 shows a source region 122 corresponding to that of the transistor 100a visible on the left part of this figure. A drain region 124 corresponding to that of the transistor 100b visible on the right part of this figure is also shown. Finally, this epitaxy also forms a region 126 common to the two transistors 100a, 100b, forming the drain region of the transistor 100a and also the source region of the transistor 100b. These source and drain regions 122, 124, 126 correspond to second semiconducting portions.

This epitaxy is applied such that the source and drain regions 122, 124, 126 comprise at least one semiconducting material for which the crystalline structure could be modified when it is subsequently exposed to a heat treatment. This ability to have a crystalline structure that can be modified by application of a heat treatment may for example be obtained because the semiconducting material is fabricated in a metastable state. For example, such a semiconducting material may be silicon doped with carbon atoms (Si:C) or SiGe doped with carbon atoms (SiGe:C). In these examples of semiconducting materials, carbon is present in a proportion, or atomic proportion, for example between about 1% and 3%. In the example embodiment described herein in which the fabricated transistors 100 correspond to P type transistors with silicon channels, an SiGe:C or Si:C epitaxy is used to form the source and drain regions 122, 124, 126.

This semiconducting material may preferably be doped in situ, for example by boron atoms, in order to confer the required conductivity on it depending on the type of transistor being made, in this case P doping for a P type transistor.

During fabrication of the source and drain regions 122, 124, 126 by epitaxy, carbon atoms present in the semiconducting material of these regions are substituted for some atoms of the semiconductor, which implies that the mesh parameter of the semiconducting material is smaller than the mesh parameter of the semiconductor alone without carbon atoms. A heat treatment is then applied so that the carbon in the above examples precipitates. The consequence of this precipitation is that the mesh parameter of the semiconducting material changes and becomes equal to the value of the natural mesh parameter of the semiconducting chemical element used to form the semiconducting material without carbon. In the example embodiment described herein, the effect of the heat treatment is that the volume of SiGe:C or Si:C in the source and drain regions 122, 124, 126 increases and thus adds a compression stress in the channels formed by the portions 114. On FIG. 6, this compression stress is symbolically represented by the double arrow 128.

In the example embodiment described herein, the region 126 is common to the two visible transistors 100a, 100b and is located between the portions 114, 116 of the two transistors 100a, 100b. Thus, the ends of the region 126 bear in contact with these portions 114, 116 of the two transistors 100a, 100b that therefore form bearing surfaces. Since the regions 122, 124 are also common to other transistors adjacent to the two transistors 100 fabricated according to this method, the ends of the regions 122, 124 are also bearing in contact with semiconductor portions that will be used to fabricate channels of these adjacent transistors (not shown on FIGS. 1 to 8). The fact that the ends of the regions 122, 124, 126 are in contact with bearing surfaces contributes to creation of the strain within these regions because if the ends of these regions were facing free surfaces, the change to the mesh parameter within these regions would not cause the creation of a such a high strain in the channels as it does in this case.

The heat treatment application temperature to trigger precipitation of the chemical element whose atoms are substituted for the atoms of the semiconductor depends on the nature of this chemical element and also on the proportion of this chemical element in the semiconducting material. In the examples of semiconducting materials described above (Si:C and SiGe:C), the minimum temperature that triggers precipitation of carbon elements reduces as the concentration of carbon elements in the semiconducting material increases. For example, the temperature at which the heat treatment is applied may for example be between about 700° C. and 1050° C., with a duration between about 1 second and 10 minutes. This heat treatment may be performed in a furnace, using RTP ("Rapid Thermal Processing") or RTA ("Rapid Thermal Annealing") type equipment, etc.

In the method described above, the heat treatment that triggers precipitation of the chemical element that substitutes its atoms in the semiconducting material is applied just after epitaxy forming this semiconducting material. To be efficient, this heat treatment can be applied before the final gates of the transistors 100 are made.

Figure 7:
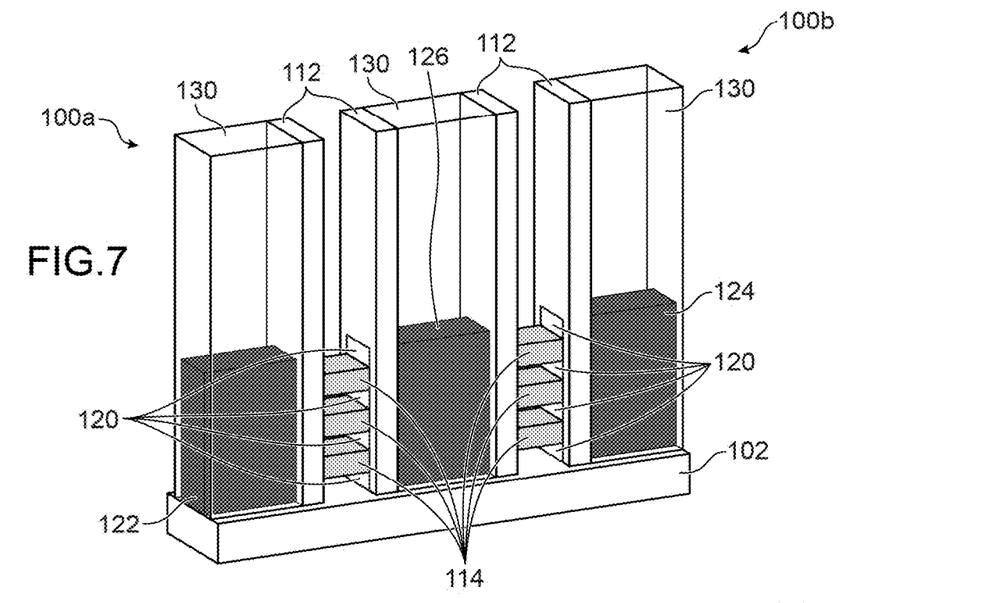
Figure 8:
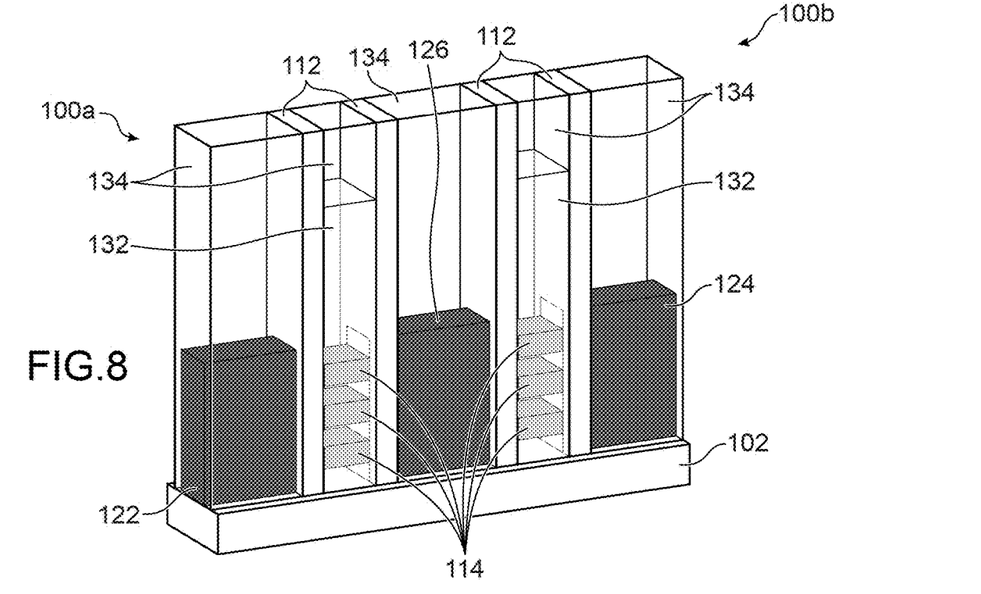

The FET transistors 100 are then completed by encapsulating the source and drain regions 122, 124, 126 by a deposit of a dielectric material 130 on and around these regions, and then etching the dummy gates 110 and the parts of the portions 116 previously covered by the dummy gates 110 (FIG. 7). Final gates 132, each formed from a gate dielectric and a conducting material, are then made in the locations released by etching the dummy gates 110, then the electrical contacts 134 of the gates 132 and the source and drain regions 122, 124, 126 are made by depositing an electrically conducting material on these elements (FIG. 8).

The method described above can also be used to make N type transistors in which it is required to create a tensile strain in the channel. The semiconductor portions 116 that will form the channels of such transistors may comprise germanium, and the semiconducting material made to form the source and drain regions 122, 124, 126 may correspond to GeSn, in this case tin being the chemical element that can precipitate when a heat treatment is applied. Thus, before application of the heat treatment, the mesh parameter of GeSn is larger than the mesh parameter of germanium in the transistor channels. Application of the heat treatment, for example at a temperature between about 700° C. and 900° C., then causes precipitation of tin present in the GeSn. The mesh parameter of the material in the source and drain regions 122, 124, 126 reduces, thus causing a tensile strain in the channel region of the transistors. For example, the temperature at which the heat treatment is applied in this configuration may for example be between about 700° C. and 900° C., for a duration of between about 1 second and 10 minutes.

In the case of transistors fabricated adjacent to each other and connected in series, the source and drain regions are preferably made such that they are common to two adjacent transistors, as described above. However, a semiconducting material that is in a metastable state can also be used to make the source and drain regions of one or several isolated transistors, in other words that do not have common source and drain regions. In this case, the bearing surfaces with which the ends of the semiconducting portions that form the source and drain regions are formed by the encapsulation material(s) formed around these semiconducting portions, for example SiN and/or $SiO_2$.

Figure 9:
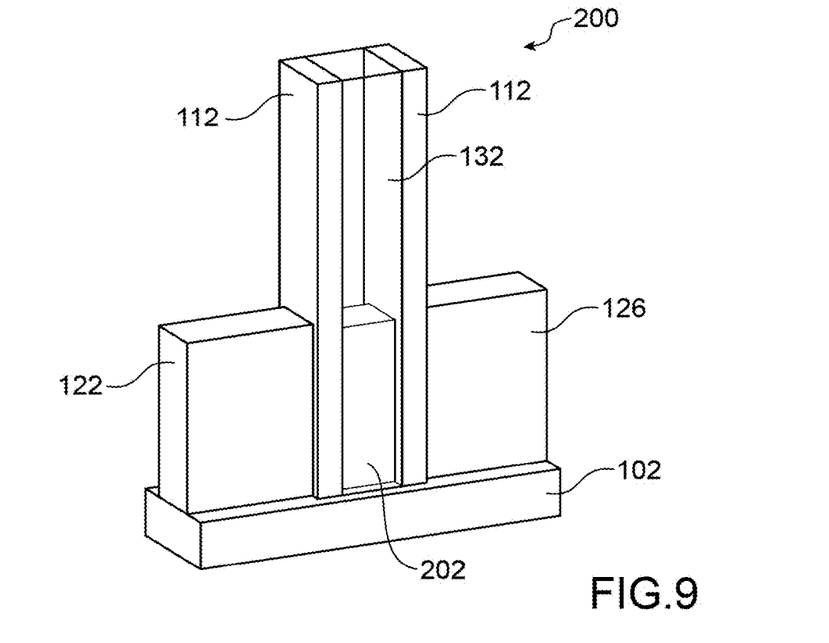
FIG. 9 diagrammatically shows a transistor obtained using a method of fabricating strained channel FET transistors according to a second embodiment of this invention.

In the first embodiment described above, the fabricated transistors 100 are GAAFET transistors, in other words transistors for which the channels are formed by one or several semiconducting nanowires surrounded by gates. As a variant, this method can be used to make FinFET type transistors 200, like the transistor shown on FIG. 9. In such a FinFET transistor 200, the channel is formed by a single semiconducting portion 202 in the shape of a fin and surrounded by the gate 132. The strain is generated in this portion 202 by making the source and drain 122, 126 in the same way as described above for GAAFET transistors. To make such a FinFET transistor 200, the material initially formed on the substrate 102 does not correspond to a stack of alternating layers of two different semiconducting materials, but rather to a single layer of semiconducting material. The steps described above with reference to FIGS. 3 and 4 to form internal spacers 120 are not used when fabricating such FinFET transistors. Furthermore, nor is the step to etch the portions 114 used previously to fabricate GAAFET transistors used to fabricate FinFET transistors 200.

The method described above to fabricate strained channel FET transistors can also be used to make vertical transistors named VFET transistors 300. Such a VFET transistor 300 is shown diagrammatically on FIGS. 10 and 11.

Figure 10:
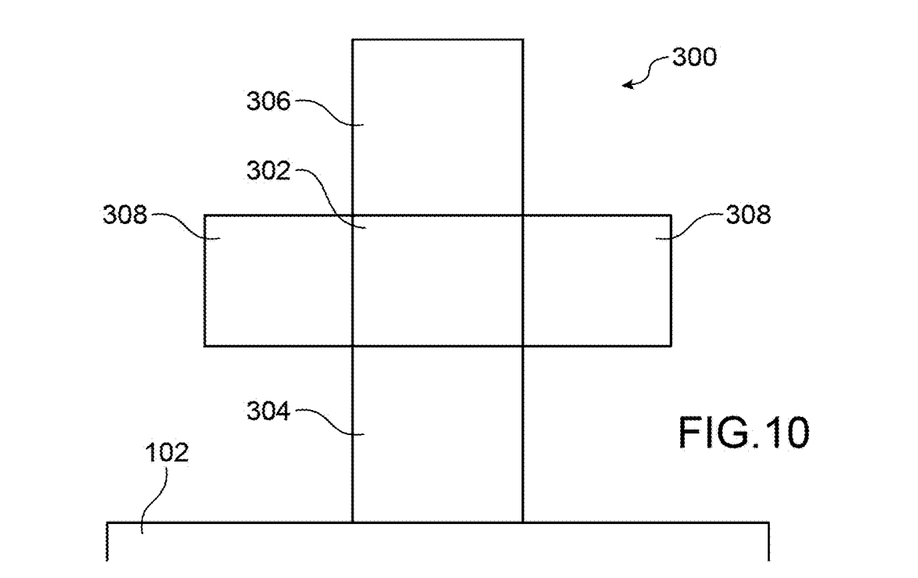
FIGS. 10 and 11 diagrammatically show a transistor obtained using a method of fabricating strained channel FET transistors according to a third embodiment of this invention.
Figure 11:
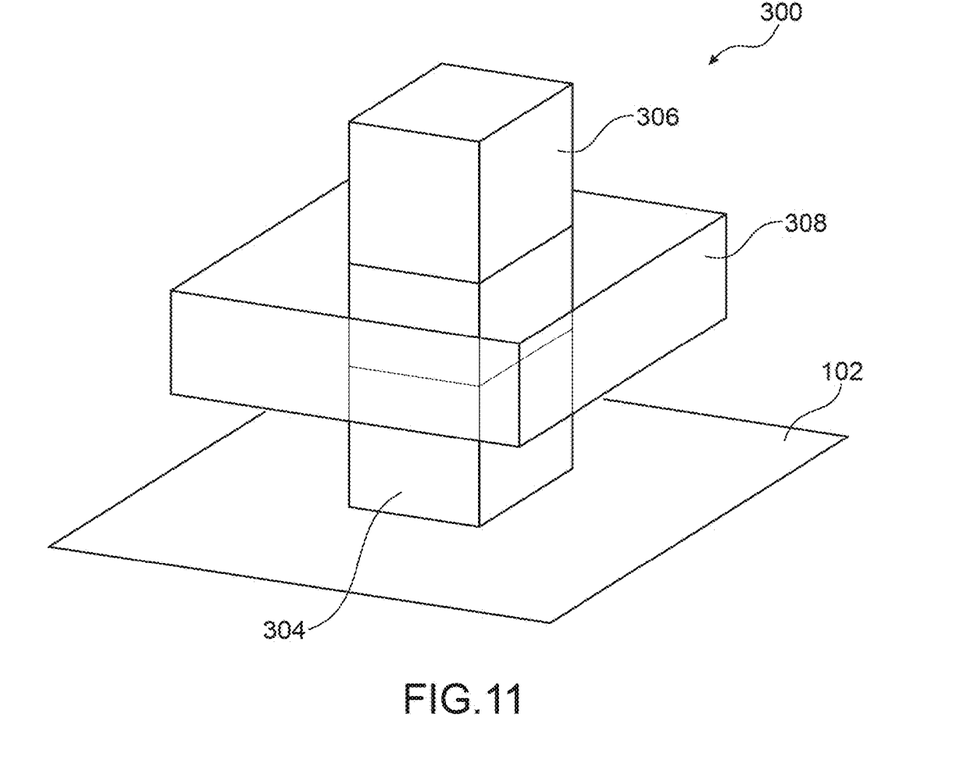

The VFET transistor 300 comprises a first semiconducting portion 302 forming the channel region of the VFET transistor 300 and inserted between two semiconducting portions 304, 306 corresponding to the source and drain regions of the transistor 300. A gate 308 is formed around the first semiconducting portion 302. Electrical contacts, not shown on FIGS. 10 and 11, are also fabricated to make electrical contact with the gate 308 and the second semiconducting portions 304, 306.

The semiconducting portions 302, 304, 306 are fabricated by the sequential application of epitaxy steps of the different semiconductors on the substrate 102, for example the same as those described above for fabrication of GAAFET transistors 100 (silicon for the first semiconducting portion 302 and Si:C or SiGe:C for the second semiconducting portions 304, 306, or germanium for the first semiconducting portion 302 and GeSn for the second semiconducting portions 304, 306, depending on the type (N or P) of the transistor 300).

In such a VFET transistor 300, the use of a semiconducting material for which the crystalline structure can be modified by the application of a heat treatment is advantageous because after a bearing surface has been formed on the second portion 306, in other words in contact with one end of the second portion 306 opposite the end in contact with the first semiconducting portion 302, application of the heat treatment causing precipitation of the chemical element of which the atoms change from the substitution state to the interstitial state, creating a difference in mesh parameters resulting in a change to the volume of portions 304, 306 and creation of a strain within the channel of the VFET transistors 300, due to the same phenomenon as that described above for GAAFET transistors 100 and FinFET transistors 200. The strain created in the channel can be a compressive strain in the case of a P type transistor, or a tensile strain in the case of an N type transistor. The application conditions of the heat treatment for creating the strain in the channel of the transistor 300 can be similar to the conditions described previously for GAAFET transistors 100 and FinFET transistors 200.

The invention claimed is:

1. A method of making at least one FET transistor, comprising:
fabricating at least one first semiconducting portion, thereby forming a channel of the FET transistor,
fabricating second semiconducting portions, thereby forming source and drain regions of the FET transistor, such that the first semiconducting portion is located between first ends of the second semiconducting portions, such that second ends of the second semiconducting portions opposite the first ends, are in contact with bearing surfaces, and the second semiconducting portions comprises at least one semiconducting material comprising a crystalline structure; and
applying a heat treatment, thereby generating a modification to the crystalline structure of the at least one semiconducting material of the second semiconducting portions thereby forming, at the end of the heat treatment, source and drain regions of the FET transistor and creating a strain in the first semiconducting portion;
wherein, before applying the heat treatment, the at least one semiconducting, material of the second semiconducting portions is in a metastable state, or wherein, during the heat treatment, the modification of the crystalline structure of the semiconducting, material is a phase change of the semiconducting, material.

2. The method according to claim 1,
wherein the at least one semiconducting material of the second semiconducting portions comprises at least one chemical element that is precipitated during application of the heat treatment.

3. The method according to claim 2, wherein
the at least one semiconducting material of the second semiconducting portions comprises silicon or SiGe,
the at least one chemical element comprises carbon, and
the FET transistor is of a P type.

4. The method according to claim 3,
wherein an atomic percentage of carbon in the at least one semiconducting material is between about 1% and 3%.

5. The method according to claim 2, wherein
the at least one semiconducting material of the second semiconducting portions comprises germanium,
the at least one chemical element comprises tin, and
the FET transistor is of an N type.

6. The method according to claim 1,
wherein the second semiconducting portions are fabricated by epitaxy.

7. The method according to claim 2,
wherein when the FET transistor is of a P type,
an epitaxy that forms the second semiconducting portions also dopes the at least one semiconducting material of the second semiconducting portions.

8. The method according to claim 1,
wherein the heat treatment is applied at a temperature between about 700° C. and 1050° C. and/or for a duration between about 1 second and 10 minutes.

9. The method according to claim 1,
wherein the FET transistor is of a FinFET, GAAFET or VFET type.

10. The method according to claim 9,
wherein when the FET transistor is of a GAAFET type, and
wherein the fabricating the first semiconducting portion comprises:
etching a stack of layers formed on a substrate and comprising at least one layer of a first semiconducting material, thereby forming the first semiconducting portion located between the substrate and at least one layer of a second semiconducting material different from the first semiconducting material and that is optionally etched selectively relative to the first semiconducting material, thereby forming at least one stack of nanowires comprising at least one nanowire of the second semiconducting material located between the substrate and at least one nanowire of the first semiconducting material,
fabricating at least one dummy gate and external spacers between which the dummy gate is formed, covering at least part of the stack of nanowires formed from portions of the nanowires of the first and second semiconducting materials,
etching the stack of nanowires such that said part of the stack of nanowires is kept,
removing parts of the portion of the nanowire of the second semiconducting material covered by external spacers, thereby forming cavities located under the external spacers, and
depositing at least one dielectric material in the cavities, thereby forming internal spacers,
wherein the second semiconducting portions are fabricated by epitaxy after the first semiconducting portion is fabricated,
and also comprising, after application of the heat treatment:
depositing a dielectric material encapsulating the second semiconducting portions,
removing the dummy gate, and
fabricating a gate between the external spacers) and around the first semiconducting portion.

11. The method according to claim 1,
wherein several FET transistors) formed thereby are located adjacent to each other such that some second semiconducting portions form source and drain regions common to adjacent FET transistors in pairs.

12. The method according to claim 9,
wherein, when the fabricated transistor is of a VFET type,
wherein fabricating the first and second semiconducting portions comprises:
forming an epitaxy of one of the second semiconducting portions on a substrate,
forming an epitaxy of the first semiconducting portion on said one of the two semiconducting portions, and
forming an epitaxy of the other second semiconducting portion on the first semiconducting portion, and
wherein the heat treatment is applied after deposition of at least one dielectric material encapsulating the second semiconducting portions and forming at least a first of the bearing surfaces, or after the fabrication of electrical contacts connected to the second semiconducting portions and forming at least the first of the bearing surfaces, a second of the bearing surfaces being formed by the substrate.

* * * * *